United States Patent
Wang et al.

(10) Patent No.: US 12,189,300 B2
(45) Date of Patent: Jan. 7, 2025

(54) SCANNING INTERFERENCE LITHOGRAPHIC SYSTEM

(71) Applicants: TSINGHUA UNIVERSITY, Beijing (CN); BEIJING U-PRECISION TECH CO., LTD., Beijing (CN)

(72) Inventors: Leijie Wang, Beijing (CN); Yu Zhu, Beijing (CN); Ming Zhang, Beijing (CN); Jitao Xu, Beijing (CN); Rong Cheng, Beijing (CN); Jiankun Hao, Beijing (CN); Kaiming Yang, Beijing (CN); Xin Li, Beijing (CN); Siqi Gao, Beijing (CN); Yujiao Fan, Beijing (CN)

(73) Assignee: Tsinghua University; Beijing U-Precision Tech Co., Ltd., Bejing (CN)

( * ) Notice: Subject to any disclaimer, the term of this patent is extended or adjusted under 35 U.S.C. 154(b) by 0 days.

(21) Appl. No.: 17/767,416

(22) PCT Filed: Oct. 23, 2020

(86) PCT No.: PCT/CN2020/123224
§ 371 (c)(1),
(2) Date: Apr. 7, 2022

(87) PCT Pub. No.: WO2021/083044
PCT Pub. Date: May 6, 2021

(65) Prior Publication Data
US 2024/0264534 A1 Aug. 8, 2024

(30) Foreign Application Priority Data
Oct. 31, 2019 (CN) .......................... 201911050366.9

(51) Int. Cl.
*G03F 7/00* (2006.01)

(52) U.S. Cl.
CPC ...... *G03F 7/70408* (2013.01); *G03F 7/70025* (2013.01); *G03F 7/70191* (2013.01); *G03F 7/7085* (2013.01)

(58) Field of Classification Search
CPC ............ G03F 7/70408; G03F 7/70025; G03F 7/70191; G03F 7/7085
See application file for complete search history.

(56) References Cited

U.S. PATENT DOCUMENTS

| 6,556,280 B1 * | 4/2003 | Kelsey ................ G03F 7/70408 |
| | | 355/71 |
| 6,882,477 B1 | 4/2005 | Schattenburg et al. |

(Continued)

FOREIGN PATENT DOCUMENTS

| CN | 103698983 A | 4/2014 |
| CN | 107643656 A | 1/2018 |

(Continued)

OTHER PUBLICATIONS

Liang, Shun , "Error Analysis and Virtual Prototype Modeling and Control of Scanning Interference Lithography Based on ZEMAX", Non-official translation: Master's Dissertation of University of Electronic Science and Technology of China, Apr. 1, 2019, 6-46.

(Continued)

*Primary Examiner* — Peter B Kim
(74) *Attorney, Agent, or Firm* — Holzer Patel Drennan

(57) ABSTRACT

Disclosed is a scanning interference photolithography system, comprising a heterodyne optical path, a first interference optical path, a second interference optical path, a motion platform and a control subsystem, wherein a substrate is carried on the motion platform, a displacement measurement interferometer is used to measure the displacement of the motion platform, a first light beam and a second light beam are focused on the substrate for interference exposure; the control subsystem generates instructions (Continued)

according to various measurement information, adjusts angles of corresponding devices or the phase of a light beam, and locks the phase shift of interference exposure fringes of the first light beam and the second light beam. The system has a high precision of fringe pattern locking and a high laser utilization rate, and can be used for producing a large-area high-precision dense grating line gradient periodic grating.

10 Claims, 3 Drawing Sheets

(56) References Cited

U.S. PATENT DOCUMENTS

| | | | | |
|---|---|---|---|---|
| 7,474,385 B2* | 1/2009 | Markoya | ............... | G03F 7/7035 355/55 |
| 10,133,007 B2* | 11/2018 | Li | ................ | G02B 6/2856 |
| 2007/0153250 A1* | 7/2007 | Sewell | ................ | G03F 7/70408 355/71 |
| 2015/0331330 A1* | 11/2015 | Markle | ................ | G03F 7/7045 355/71 |

FOREIGN PATENT DOCUMENTS

| | | |
|---|---|---|
| CN | 110837214 A | 2/2020 |
| WO | 0135168 A1 | 5/2001 |

OTHER PUBLICATIONS

Song, Ying, "Research on the Interference Fringe Static and Dynamic Phase-locking Technology in the Lithography System of the Holographic Grating", Doctoral Dissertations, Graduate School of Chinese Academy of Sciences, Dec. 1, 2014, 13-72.

Wang, Wei, "Beam Alignment Error and Its Control in Scanning Beam Interference Lithography System", Acta Optica Sinica, vol. 37, No. 7, Jul. 31, 2017, 6-10.

Wang, Leijie, et al., "Ultra-precision Phase-shifting Locking System of Scanning Beam Interference Lithography Tool", Optics and Precision Engineering, vol. 27, No. 8, Aug. 15, 2019, 1765-1773.

Zhu, Yu, et al., "Novel homodyne frequency-shifting interference: pattern locking system", Chinese Optics Letters, vol. 14, No. 6, Jun. 10, 2016.

* cited by examiner

SCANNING INTERFERENCE LITHOGRAPHIC SYSTEM

This application claims the priority and benefits of Chinese Patent Application No. 201911050366.9 filed on Oct. 31, 2019, the whole contents of which are incorporated herein by reference.

TECHNICAL FIELD

The present disclosure relates to the technical field of optical instrumentation, and particularly, to a scanning interference photolithography system.

BACKGROUND ART

In recent years, the performance requirements for grating devices used in major engineering projects such as large-scale astronomical telescopes, inertial confinement nuclear fusion laser ignition systems, photolithography systems, etc. are continuously increasing, and the performance parameters of the grating devices are developing towards nanometer-level precision and sub-10,000-level grid line density. Meanwhile, the types of application are getting more diversified, including two-dimensional gratings, curved variable-period gratings and so on.

As an important technology for producing micro-nano array devices, scanning interference photolithography may realize the fabrication of large-scale and high-precision dense grid lines. The scanning interference photolithography is substantially achieved by a pattern development technology that exposing an interference pattern generated by a multi-laser interference on the surface of a photosensitive substrate, and has become the mainstream in the fabrication technology of large-scale and high-precision dense grid line gratings.

The primary difficulty of laser interference photolithography technology lies in the precision control in the fabrication of large-area high-precision gratings. There is great difficulty in research and develop of high-precision laser interference photolithography system. Many well-known grating fabrication system companies and research institutions in the world have launched a series of studies on the research and development of high-precision interference photolithography systems, and the studies mainly focuses on high-precision interference photolithography systems.

In a laser interference photolithography system commonly used in the prior art, an exposure light source forms an interference pattern at a substrate through an optical path for splitting and reflecting; due to the influence of vibration and air disturbance, the interference pattern on the substrate may drift, and thereby affecting the exposure quality. Lights guided from two exposure beams are coincided and incident onto a CCD (Charge-coupled Device) to form interference fringes; the CCD monitors the movement of a spatial interference fringe image to obtain the drift of the interference pattern at the substrate, and inputs the drift as a feedback to a processor; the processor controls a piezoelectric ceramic to drive a mirror base to adjust the phase of the interference pattern, and thus the interference pattern may be locked to obtain better exposure quality. The piezoelectric ceramic has a relatively large modulation range but a relatively low modulation speed, and due to the limitation of resolution and frame rate of the CCD, it is difficult to achieve the fabrication of high-performance grating.

Some scholars have proposed a scanning interference photolithography system based on homodyne locking, in which the exposure light source forms an interference pattern at a substrate through an optical path for splitting and reflecting. In the system, in order to prevent the interference pattern from drifting, a beam splitter near the substrate is used to extract left and right exposure beams to form two interference signals, which are subjected to photoelectric conversion to obtain voltage signals. The interference pattern is affected by external interference and thus causes a phase shift, resulting in a change of voltage signals, and the voltage signals are used as feedback to control a phase modulator to adjust the phase of the interference pattern so as to keep the voltage stable, and thus achieve the locking of the interference pattern. A measurement signal of a two-channel homodyne heterodyne phase meter used herein is a DC signal, which has poor anti-interference ability and is difficult to achieve high-precision measurement, and there is also difficulty in phase retrieval, subdivide and direction judgment, so it cannot meet the requirements for high-precision locking.

A scanning interference photolithography system is disclosed in the U.S. Pat. No. 6,882,477B1. The photolithography system forms interference pattern exposure by interfering two beams of collimated small-size light, the exposure beam is focused by a lens to change the exposure angle, and a variable-period interference photolithography is thus achieved. The system adopts a pattern control system based on heterodyne measurement method, wherein a phase of the exposure beam is detected, the detected phase is fed back to a processor, an acousto-optic modulator is controlled by the processor, whereby the pattern locking is achieved; a motion error may occur during a scanning-stepping process of a motion platform carrying a substrate, which may cause dynamic drift of the grating pattern with respect to the substrate. The patent further discloses a scanning interference photolithography technology, where a light beam turns back through a mirror and focuses on the substrate to realize interference exposure; however, measurement signals are separated due to the beam offset when variable-period exposure is performed, therefore the system cannot achieve high-precision control for the interference pattern.

It can be seen from the above that the scanning interference photolithography in the prior art has certain limitations, and it is difficult to realize fabrication of high-precision variable-period grating.

SUMMARY

In order to solve the above problems, the present disclosure provides a scanning interference photolithography system, including:

a heterodyne optical path, a laser light emitted by a laser is split into a zero-order diffracted light and a first-order diffracted light by a first phase modulator, wherein the first-order diffracted light is sequentially reflected by a third mirror, a fourth mirror and a third universal mirror, is transmitted by a fourth lens, and becomes a heterodyne beam of a heterodyne phase meter;

a first interference optical path, the zero-order diffracted light split by the first phase modulator is reflected to a grating beam splitter by a first mirror, and is split into a first light beam and a second light beam by the grating beam splitter, wherein the first light beam sequentially passes through a third phase modulator, is reflected by a second universal mirror and is transmitted by a second lens to a splitting prism, the light transmitted by the splitting prism travels to an angle measurement module, the light reflected by the splitting prism travels to a beam extraction mirror, the light transmitted by the beam extraction mirror travels to a third lens and is transmitted by the third len, and then is focused on a substrate, wherein the light reflected by the beam extraction mirror is a first input beam of the heterodyne phase meter;

a second interference optical path, the second light beam split by the grating beam splitter sequentially passes through a second phase modulator, is reflected by a second mirror and a first universal mirror, and is transmitted by a first lens to the splitting prism, and the light reflected by the splitting prism travels to the angle measurement module, the light transmitted by the splitting prism travels to the beam extraction mirror, and the light transmitted by the beam extraction mirror travels to the third lens and is transmitted by the third lens, and then is focused on the substrate, wherein the light reflected by the beam extraction mirror is a second input beam of the heterodyne phase meter;

a motion platform, the substrate is carried on the motion platform, a displacement measurement interferometer is used to measure the displacement of the motion platform, the first light beam and the second light beam are focused on the substrate for interference exposure, a grating interference pattern is projected onto the glue-coated substrate, and a grating is then obtained through subsequent preparation processes such as development, etching and cleaning; and a control subsystem, two interference measurement electrical signals are obtained by the heterodyne phase meter from the first input beam, the second input beam, and the heterodyne beam and are transmitted to a signal receiving part, angle information of the first light beam and the second light beam are obtained by the angle measurement module and are transmitted to the signal receiving part, and displacement information of the motion platform is measured by the displacement measurement interferometer and is transmitted to the signal receiving part, and the information is then transmitted to a processor from the signal receiving part to perform calculation so as to obtain information about phase shift of exposure fringe, the processor generates a compensation instruction and transmits it to a phase modulation actuator, and the phase modulation actuator sends the compensation instruction to the first phase modulator, the second phase modulator and the third phase modulator to perform phase modulation, so as to complete the locking of the phase shift of exposure fringe; the processor generates a control command and transmits it to a driver to adjust angles of the first universal mirror, the second universal mirror, and the third universal mirror so as to adjust the angle at which the first light beam and the second light beam are focused on the substrate for exposure, meanwhile, a reference light and a measurement light remain combined, such that a beam offset may not affect an intensity change of a phase measurement signal during a variable period, and, the heterodyne phase meter based on heterodyne measurement principle measures the phase between the exposure beams, modulates the phase and enables the phase of the exposure beams to be locked to a grating substrate, and realizes control of interference fringes.

Preferably, the system further includes a base and a vibration isolator. The heterodyne optical path, the first interference optical path, the second interference optical path, the motion platform and the control subsystem are disposed on the base, and the vibration isolator is mounted at bottom of the base.

Preferably, the heterodyne phase meter includes a first wave plate, a first polarization splitting prism, a second wave plate, a second polarization splitting prism, a polarizer, a first photodetector, a second photodetector, a third polarization splitting prism, a mirror, a third wave plate, a retroreflector and a fourth wave plate. The optical path of the heterodyne phase meter is described as follows:

A heterodyne light beam is incident from the first wave plate, is changed into a circular polarization state after being transmitted by the first wave plate and incidents onto the first polarization splitting prism, the light reflected by the first polarization splitting prism is transmitted to the retroreflector through the fourth wave plate, reflected by the retroreflector, then turns back, and is changed into a p polarization state after being transmitted by the fourth wave plate, then the light is sequentially transmitted by the first polarization splitting prism, the second polarization splitting prism, and the polarizer to form a first reference light; the light transmitted by the first polarization splitting prism is transmitted to the mirror through the third wave plate, reflected back to the third wave plate by the mirror, and changed into a s polarization state to the first polarization splitting prism after being transmitted by the third wave plate, then it is changed into the p polarization state after being reflected by the first polarization splitting prism and transmitted by the second wave plate, then it is sequentially transmitted by the second polarization splitting prism and the polarizer to form a second reference light;

The first input beam in the s polarization state is incident from an incident surface of the third polarization splitting prism, is sequentially reflected by the third polarization splitting prism and the second polarization splitting prism, and then is transmitted by the polarizer to form a first measurement light;

The second input beam, which is parallel to the first input beam, is incident from the incident surface of the third polarization splitting prism in the s polarization state, is sequentially reflected by the third polarization splitting prism and the second polarization splitting prism, and is then transmitted by the polarizer to form a second measurement light;

The first measurement light combines with the first reference light to form an interference measurement signal, which is incident to the first photodetector; the second measurement light combines with the second reference light to form another interference measurement signal, which is incident to the second photodetector;

The first photodetector and the second photodetector convert the received interference measurement signal into an electrical signal and then transmit it to the signal receiving part, respectively.

Preferably, the first lens, the second lens, the third lens, and the fourth lens are convex lenses.

Preferably, the second phase modulator and the third phase modulator are acousto-optic modulators.

Further, the first wave plate, the third wave plate and the fourth wave plate are quarter wave plates.

Further, the second wave plate is a half wave plate.

Further, the motion platform moves in a step-by-step manner, the first universal mirror, the second universal mirror and the third universal mirror adjust angles according to a stepping period, and a linear gradient periodic grating is obtained through subsequent preparation processes such as development, etching and cleaning, etc.

Further, the motion platform moves in a step-by-step manner, the first universal mirror, the second universal mirror and the third universal mirror adjust angles according to a stepping period, and the first phase modulator, the second phase modulator and the third phase modulator perform phase modulation to adjust a fixed frequency difference according to the stepping period, and a curved gradient periodic grating is obtained through subsequent preparation processes such as development, etching and cleaning, etc.

Further, the system includes a dual-frequency laser, a second splitting prism and a fifth mirror, the displacement measurement interferometer includes an X-axis displacement measurement interferometer and a Y-axis displacement measurement interferometer. The laser light emitted by the dual-frequency laser is split by the second splitting prism, one beam of the split light is sent to the X-axis displacement measurement interferometer, and the other beam is sent to the Y-axis displacement measurement interferometer after passing through the fifth mirror.

The scanning interference photolithography system provided by the present disclosure has the advantage of high fringe pattern locking accuracy and high laser utilization and so on. Based on the conventional scanning interference photolithography system technology, the present scanning interference photolithography system uses a heterodyne phase meter based on heterodyne measurement principle to measure the phase between the exposure beams, a beam offset may not affect an intensity change of the measurement signal during the variable period, and the measurement signal remain combined, so as to achieve a real-time measurement; a displacement measurement interferometer is used to measure a motion error of the motion platform during the exposure, a control subsystem locks the phase of the exposure beams to the grating substrate by compensating the phase drift of the interference pattern and a relative error of the motion platform during the movement of the motion platform to realize the control on the interference fringes. The scanning interference photolithography system can be used for producing a gradient periodic grating with large-area, high-precision, and dense grating lines.

1—laser, 2—first mirror, 3—grating beam splitter, 401—second mirror, 402—first universal mirror, 403—first lens, 501—second universal mirror, 502—second lens, 6—splitting prism, 7—heterodyne phase meter, 701—first wave plate, 702—first polarization splitting prism, 703—second wave plate, 704—second polarization splitting prism, 705—polarizer, 706—first photodetector, 707—second photodetector, 708—third polarization splitting prism, 711—mirror, 712—third wave plate, 713—retroreflector, 714—the fourth wave plate, 8—control module, 801—signal receiving part, 802—processor, 803—driver, 804—phase driver, 9—angle measurement module, 10—third lens, 11—substrate, 12—third mirror, 13—fourth mirror, 14—third universal mirror, 15—fourth lens, 16—beam extraction mirror, 17—first phase modulator, 18—second phase modulator, 19—three-phase modulator, 20—base, 21—motion platform, 22—vibration isolator, 23—displacement measurement interferometer, 24—dual-frequency laser, 25—second splitting prism, 26—fifth mirror.

DETAILED DESCRIPTION OF THE EMBODIMENTS

In order to further illustrate the technical means adopted by the present disclosure to solve the technical problems and the technical effects achieved thereof, the present disclosure will be further described in detail below in conjunction with the accompanying drawings and specific embodiments. It should be noted that the drawings are schematic and are not drawn completely in accordance with size or scale, so the accompanying drawings and specific embodiments are not intended to limit the scope of the present disclosure.

Figure 1:
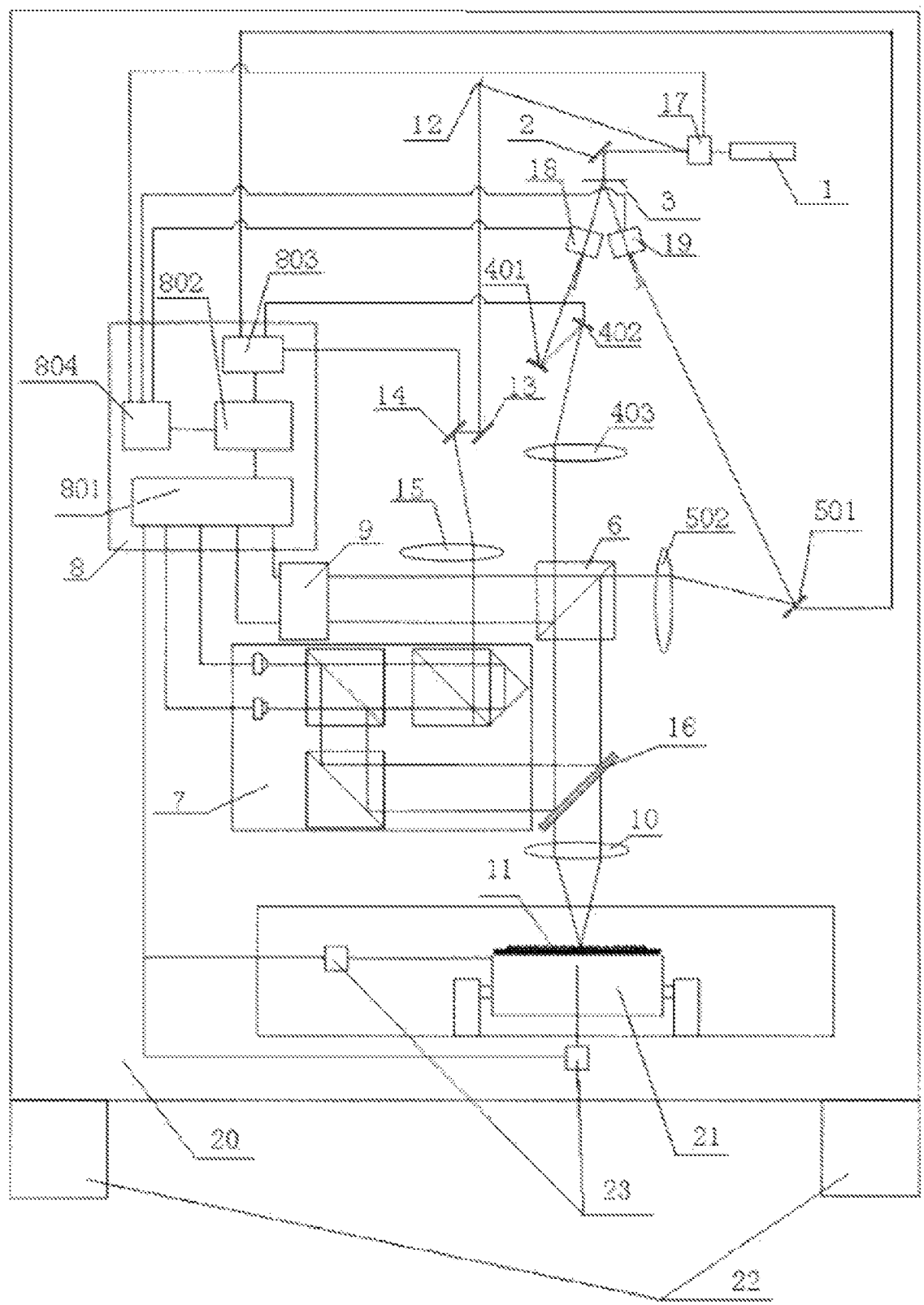
FIG. 1 is a schematic diagram of an embodiment of the scanning interference photolithography system of the present disclosure.

As an optional embodiment of the scanning interference photolithography system, the system as illustrated in FIG. 1 includes:

a heterodyne optical path, a laser light emitted by a laser 1 is split into a zero-order diffracted light and a first-order diffracted light by a first phase modulator 17, wherein the first-order diffracted light is sequentially reflected by a third mirror 12, a fourth mirror 13, and a third universal mirror 14, is transmitted by a fourth lens 15, and becomes a heterodyne beam of a heterodyne phase meter 7;

a first interference optical path, the zero-order diffracted light split by the first phase modulator 17 is reflected to a grating beam splitter 3 by a first mirror 2, and is split into a first light beam and a second light beam by the grating beam splitter 3, wherein the first light beam sequentially passes through a third phase modulator 19, is reflected by a second universal mirror 501 and is transmitted by a second lens 502 to a splitting prism 6, the light transmitted by the splitting prism 6 travels to an angle measurement module 9, the light reflected by the splitting prism 6 travels to a beam extraction mirror 16, the light transmitted by the beam extraction mirror 16 travels to a third lens 10 and is transmitted by the third lens 10, and then is focused on a substrate 11, wherein the light reflected by the beam extraction mirror 16 is a first input beam of the heterodyne phase meter 7;

a second interference optical path, the second light beam split by the grating beam splitter 3 sequentially passes through a second phase modulator 18, is reflected by a second mirror 401 and a first universal mirror 402, and is transmitted by a first lens 403 to the splitting prism 6, and the light reflected by the splitting prism 6 travels to the angle measurement module 9, the light transmitted by the splitting prism 6 travels to the beam extraction mirror 16, and the light transmitted by the beam extraction mirror 16 travels to the third lens 10 and is transmitted by the third lens 10, and is then focused on the substrate 11, wherein the light reflected by the beam extraction mirror 16 is a second input beam of the heterodyne phase meter 7;

a motion platform, the substrate 11 is carried on the motion platform 21, a displacement measurement interferometer 23 is used to measure the displacement of the motion platform 21, the first light beam and the second light beam are focused on the substrate 11 for interference exposure, and then the substrate 11 is made into a grating through subsequent preparation processes such as development, etching and cleaning; and a control subsystem, two interference measurement electrical signals are obtained by the heterodyne phase meter 7 from the first input beam, the second input beam, and the heterodyne beam, and are transmitted to a signal receiving part 801 of a control module 8, angle information of the first light beam and the second light beam are obtained by the angle measurement module 9 and are also transmitted to the signal receiving part 801, and displacement information of the motion platform 21 is measured by the displacement measurement interferometer 23 and is also transmitted to the signal receiving part 801, and the signal receiving part 801 then sends the information to a processor 802 to perform calculation so as to obtain information about phase shift of exposure fringe, the processor 802 generates a compensation instruction and transmits it to a phase modulation actuator 804, and the phase modulation actuator 804 sends the compensation instruction to the first phase modulator 17, the second phase modulator 18, and the third phase modulator 19 to perform phase modulation, so as to complete the locking of the phase shift of exposure fringe; the processor 802 generates a control command and transmits it to a driver 803 to adjust angles of the first universal mirror 401, the second universal mirror 501, and the third universal mirror 14 so as to adjust the angle at which the first light beam and the second light beam are focused on the substrate 11 for exposure;

The system further includes a base 20 and a vibration isolator 22; the heterodyne optical path, the first interference optical path, the second interference optical path, the motion platform, and the control subsystem are disposed on the base 20, and the vibration isolator 22 is mounted at bottom of the base 20 to realize the stability requirements of the whole system;

The first lens 403, the second lens 502, the third lens 10, and the fourth lens 15 described above are convex lenses; the second phase modulator 18 and the third phase modulator 19 are acousto-optic modulators.

Figure 2:
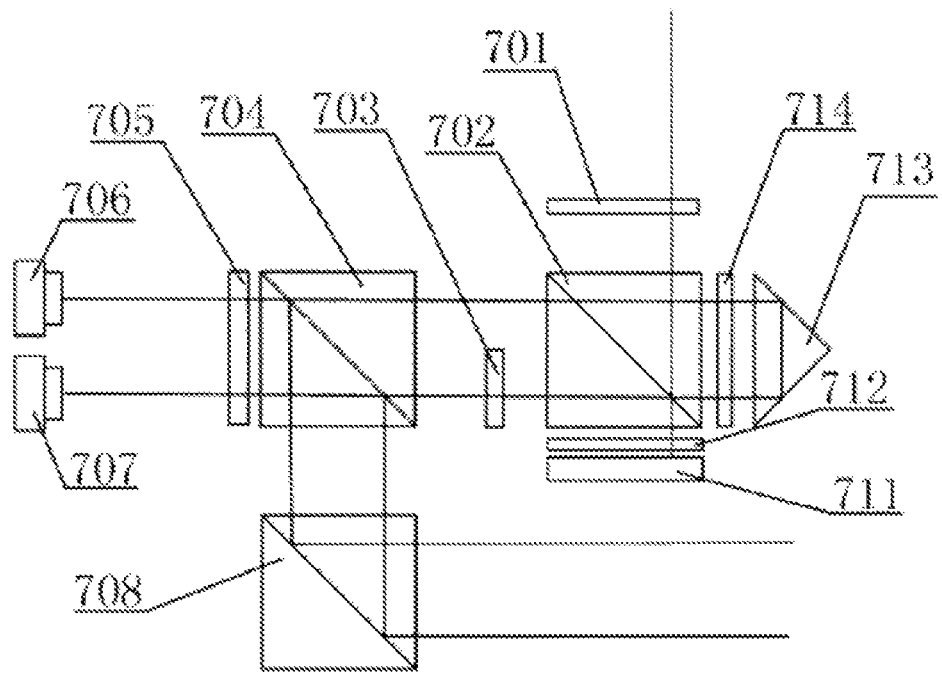
FIG. 2 is a schematic diagram of an internal optical path of the heterodyne phase meter.

The heterodyne phase meter 7 as illustrated in FIG. 2 includes a first wave plate 701, a first polarization splitting prism 702, a second wave plate 703, a second polarization splitting prism 704, a polarizer 705, a first photodetector 706, a second photodetector 707, a third polarization splitting prism 708, a mirror 711, a third wave plate 712, a retroreflector 713, and a fourth wave plate 714. The optical path of the heterodyne phase meter 7 is described as follows:

A heterodyne light beam is incident from the first wave plate 701, is changed into a circular polarization state after being transmitted by the first wave plate 701 and incidents onto the first polarization splitting prism 702, the light reflected by the first polarization splitting prism 702 is transmitted to the retroreflector 713 through the fourth wave plate 714, reflected by the retroreflector 713, then turns back, and is changed into a p polarization state after being transmitted by the fourth wave plate 714, then the light is sequentially transmitted by the first polarization splitting prism 702, the second polarization splitting prism 704, and the polarizer 705 to form a first reference light; the light transmitted by the first polarization splitting prism 702 is transmitted to the mirror 711 through the third wave plate 712, reflected back to the third wave plate 712 by the mirror 711, and changed into a s polarization state to the first polarization splitting prism 702 after being transmitted by the third wave plate 712, then it is changed into the p polarization state after being reflected by the first polarization splitting prism 702 and transmitted by the second wave plate 703, then it is sequentially transmitted by the second polarization splitting prism 704 and the polarizer 705 to form a second reference light;

The first input beam in the s polarization state is incident from an incident surface of the third polarization splitting prism 708, is sequentially reflected by the third polarization splitting prism 708 and the second polarization splitting prism 704, and then is transmitted by the polarizer 705 to form a first measurement light;

The second input beam, which is parallel to the first input beam, is incident from the incident surface of the third polarization splitting prism 708 in the s polarization state, is sequentially reflected by the third polarization splitting prism 708 and the second polarization splitting prism 704, and is then transmitted by the polarizer 705 to form a second measurement light;

The first measurement light combines with the first reference light to form an interference measurement signal, the interference measurement signal is incident to the first photodetector 706; the second measurement light combines with the second reference light to form another interference measurement signal, which is incident to the second photodetector 707;

The first photodetector 706 and the second photodetector 707 convert the received interference measurement signal into an electrical signal and then transmit it to the signal receiving part 801, respectively;

The first wave plate 701, the third wave plate 712, and the fourth wave plate 714 are quarter wave plates, and the second wave plate 703 is a half wave plate.

Figure 3:
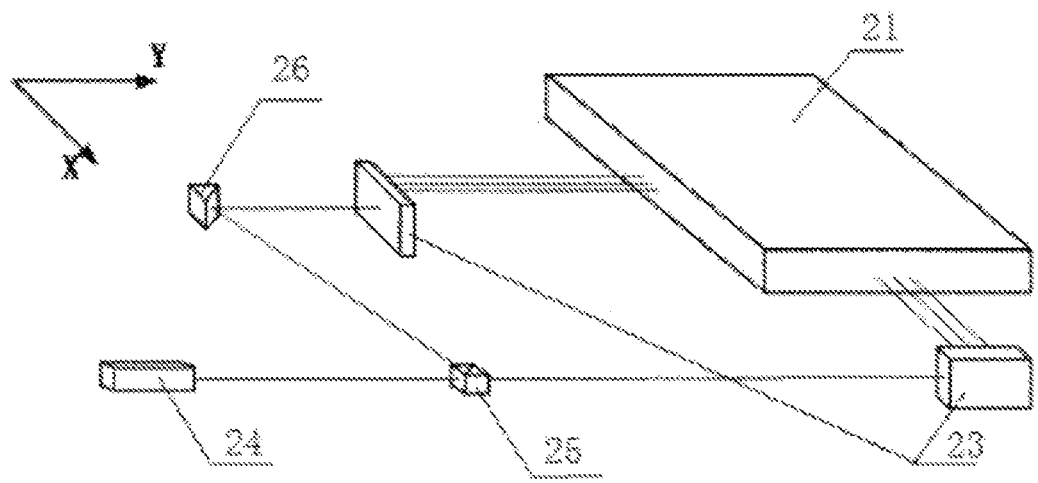
FIG. 3 is a schematic diagram of an optical path for displacement measurement of the motion platform.

The optical path for displacement measurement of the motion platform as illustrated in FIG. 3 includes a dual-frequency laser 24, a second splitting prism 25, and a fifth mirror 26. The displacement measurement interferometer 23 includes an X-axis displacement measurement interferometer and a Y-axis displacement measurement interferometer. The laser light emitted by the dual-frequency laser 24 is split by the second splitting prism 25, one beam of the split light is sent to the X-axis displacement measurement interferometer, and the other beam is sent to the Y-axis displacement measurement interferometer after passing through the fifth mirror 26. The X-axis displacement measurement interferometer and the Y-axis displacement measurement interferometer measure the displacement and error of the motion platform 21, respectively.

When producing a linear gradient periodic grating by using the system of the present disclosure, the motion platform moves in a step-by-step manner, and under the control of the control subsystem, the first universal mirror, the second universal mirror and the third universal mirror adjust angles according to the stepping period. When producing a curved gradient periodic grating, the motion platform moves in a step-by-step manner, and under the control of the control subsystem, the first universal mirror, the second universal mirror and the third universal mirror adjust angles according to the stepping period, and the first phase modulator, the second phase modulator and the third phase modulator perform phase modulation to adjust a fixed frequency difference according to the stepping period.

Figure 4:
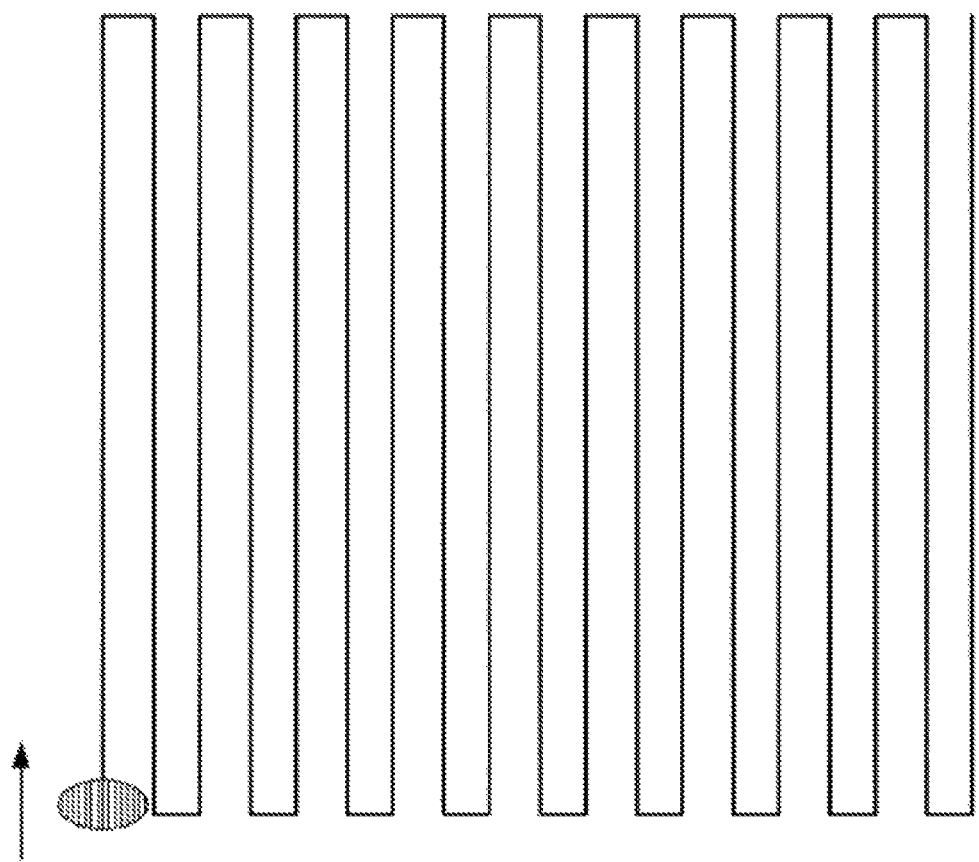
FIG. 4 shows a serpentine motion trail of the stepping motion platform of the present disclosure.

As illustrated in FIG. 4, when producing a linear variable-period grating by using the system of the present disclosure, the motion platform 21 moves step-by-step in an X-Y plane, and has a serpentine motion trail shown in the figure.

The scanning interference photolithography system of the present disclosure is based on heterodyne phase meter pattern control, uses a heterodyne phase measurement structure and a displacement measurement interferometer and can accurately measure the error of phase drift and error of substrate movement during the scanning exposure process, the control system locks and controls the phase of the interference pattern relative to the substrate, and after subsequent preparation processes such as development, etching and cleaning, etc, the fabrication of high-precision gradient periodic grating is completed.

The present disclosure may also have various other embodiments, and various corresponding changes and modifications can be made by those skilled in the art according to the present disclosure without departing from the spirit and essence of the present disclosure, but these corresponding changes and modifications should be within the scope of the claims of the present disclosure.

The invention claimed is:

1. A scanning interference photolithography system, comprising:
   a heterodyne optical path, a laser light emitted by a laser is split into a zero-order diffracted light and a first-order diffracted light by a first phase modulator, wherein the first-order diffracted light is sequentially reflected by a third mirror, a fourth mirror and a third universal mirror, is transmitted by a fourth lens, and becomes a heterodyne beam of a heterodyne phase meter;
   a first interference optical path, the zero-order diffracted light split by the first phase modulator is reflected to a grating beam splitter by a first mirror, and is split into a first light beam and a second light beam by the grating beam splitter, wherein the first light beam sequentially passes through a third phase modulator, is reflected by a second universal mirror and is transmitted by a second lens to a splitting prism, the light transmitted by the splitting prism travels to an angle measurement module, the light reflected by the splitting prism travels to a beam extraction mirror, the light transmitted by the beam extraction mirror travels to a third lens and is transmitted by the third lens, and then is focused on a substrate, wherein the light reflected by the beam extraction mirror is a first input beam of the heterodyne phase meter;
   a second interference optical path, the second light beam split by the grating beam splitter sequentially passes through a second phase modulator, is reflected by a second mirror and a first universal mirror, and is transmitted by a first lens to the splitting prism, and the light reflected by the splitting prism travels to the angle measurement module, the light transmitted by the splitting prism travels to the beam extraction mirror, and the light transmitted by the beam extraction mirror travels to the third lens and is transmitted by the third lens, and then is focused on the substrate, wherein the light reflected by the beam extraction mirror is a second input beam of the heterodyne phase meter;
   a motion platform, the substrate is carried on the motion platform, a displacement measurement interferometer is used to measure the displacement of the motion platform, the first light beam and the second light beam are focused on the substrate for interference exposure; and
   a control subsystem, two interference measurement electrical signals are obtained by the heterodyne phase meter from the first input beam, the second input beam and the heterodyne beam and are transmitted to a signal receiving part, angle information of the first light beam and the second light beam are obtained by the angle measurement module and are transmitted to the signal receiving part, and displacement information of the motion platform is measured by the displacement measurement interferometer and is transmitted to the signal receiving part, and the information is then transmitted to a processor from the signal receiving part to perform calculation so as to obtain information about phase shift of exposure fringe, the processor generates a compensation instruction and transmits it to a phase modulation actuator, and the phase modulation actuator sends the compensation instruction to the first phase modulator, the second phase modulator and the third phase modulator to perform phase modulation, so as to complete the locking of the phase shift of exposure fringe; the processor generates a control command and transmits it to a driver to adjust angles of the first universal mirror, the second universal mirror and the third universal mirror so as to adjust the angle at which the first light beam and the second light beam are focused on the substrate for exposure, meanwhile, a reference light and a measurement light remain combined, such that a beam offset does not affect an intensity change of a phase measurement signal during a variable period, and the heterodyne phase meter based on heterodyne measurement principle measures the phase between the exposure beams, modulates the phase and enables the phase of the exposure beams to be locked to a grating substrate, and realizes control of interference fringes,
   wherein the heterodyne phase meter comprises a first wave plate, a first polarization splitting prism, a second wave plate, a second polarization splitting prism, a polarizer, a first photodetector, a second photodetector, a third polarization splitting prism, a mirror, a third wave plate, a retroreflector and a fourth wave plate, and
   wherein the optical path of the heterodyne phase meter is as follows: the first input beam in an s polarization state is incident from an incident surface of the third polarization splitting prism, is sequentially reflected by the third polarization splitting prism and the second polarization splitting prism, and then is transmitted by the polarizer to form a first measurement light; the second input beam, which is parallel to the first input beam, is incident from the incident surface of the third polarization splitting prism in the s polarization state, is sequentially reflected by the third polarization splitting prism and the second polarization splitting prism, and is then transmitted by the polarizer to form a second measurement light.

2. The scanning interference photolithography system of claim 1, further comprising a base and a vibration isolator, wherein the heterodyne optical path, the first interference optical path, the second interference optical path, the motion platform and the control subsystem are disposed on the base, and the vibration isolator is mounted at bottom of the base.

3. The scanning interference photolithography system of claim 1,
   wherein the optical path of the heterodyne phase meter is further as follows:
   a heterodyne light beam is incident from the first wave plate, is changed into a circular polarization state after being transmitted by the first wave plate and incidents onto the first polarization splitting prism, the light reflected by the first polarization splitting prism is transmitted to the retroreflector through the fourth wave plate, reflected by the retroreflector, then turns back, and is changed into a p polarization state after being transmitted by the fourth wave plate, then the light is sequentially transmitted by the first polarization splitting prism, the second polarization splitting prism, and the polarizer to form a first reference light, the light transmitted by the first polarization splitting prism is transmitted to the mirror through the third wave plate, reflected back to the third wave plate by the mirror, and changed into the s polarization state to the first polarization splitting prism after being transmitted by the third wave plate, then it is changed into the p polarization state after being reflected by the first polarization splitting prism and transmitted by the second wave plate, then it is sequentially transmitted by the second polarization splitting prism and the polarizer to form a second reference light;

the first measurement light combines with the first reference light to form an interference measurement signal, which is incident to the first photodetector; the second measurement light combines with the second reference light to form another interference measurement signal, which is incident to the second photodetector;

the first photodetector and the second photodetector convert the received interference measurement signal into an electrical signal and then transmit it to the signal receiving part, respectively.

4. The scanning interference photolithography system of claim 3, wherein the first wave plate, the third wave plate and the fourth wave plate are quarter wave plates.

5. The scanning interference photolithography system of claim 3, wherein the second wave plate is a half wave plate.

6. The scanning interference photolithography system of claim 3, wherein the motion platform moves in a step-by-step manner, the first universal mirror, the second universal mirror and the third universal mirror adjust angles according to a stepping period, and a linear gradient periodic grating is obtained through subsequent preparation processes.

7. The scanning interference photolithography system of claim 3, wherein the motion platform moves in a step-by-step manner, the first universal mirror, the second universal mirror and the third universal mirror adjust angles according to a stepping period, and the first phase modulator, the second phase modulator and the third phase modulator perform phase modulation to adjust a fixed frequency difference according to the stepping period, and a curved gradient periodic grating is obtained through subsequent preparation processes.

8. The scanning interference photolithography system of claim 1, wherein the first lens, the second lens, the third lens, and the fourth lens are convex lenses.

9. The scanning interference photolithography system of claim 1, wherein the second phase modulator and the third phase modulator are acousto-optic modulators.

10. The scanning interference photolithography system of claim 1, further comprising a dual-frequency laser, a second splitting prism and a fifth mirror, wherein the displacement measurement interferometer comprises an X-axis displacement measurement interferometer and a Y-axis displacement measurement interferometer, the laser light emitted by the dual-frequency laser is split by the second splitting prism, one beam of the split light is sent to the X-axis displacement measurement interferometer, and the other beam is sent to the Y-axis displacement measurement interferometer after passing through the fifth mirror.

\* \* \* \* \*